(12) United States Patent
Song et al.

(10) Patent No.: US 9,477,207 B2
(45) Date of Patent: Oct. 25, 2016

(54) ANNULAR TIME-TO-DIGITAL CONVERTER AND METHOD THEREOF

(71) Applicant: SANCHUAN WISDOM TECHNOLOGY CO., LTD., Yingtan, Jiangxi (CN)

(72) Inventors: Caihua Song, Yingtan (CN); Xianghui Zhu, Yingtan (CN); Xianni Wang, Yingtan (CN)

(73) Assignee: SANCHUAN WISDOM TECHNOLOGY CO., LTD., Yingtan (CN)

( * ) Notice: Subject to any disclaimer, the term of this patent is extended or adjusted under 35 U.S.C. 154(b) by 0 days.

(21) Appl. No.: 14/654,516

(22) PCT Filed: Aug. 22, 2013

(86) PCT No.: PCT/CN2013/082052
§ 371 (c)(1),
(2) Date: Oct. 9, 2015

(87) PCT Pub. No.: WO2014/173050
PCT Pub. Date: Oct. 30, 2014

(65) Prior Publication Data
US 2016/0132024 A1    May 12, 2016

(30) Foreign Application Priority Data

Apr. 27, 2013    (CN) .......................... 2013 1 0152606

(51) Int. Cl.
| | | |
|---|---|---|
| H03M 1/50 | (2006.01) |
| G04F 10/00 | (2006.01) |
| H03K 5/135 | (2006.01) |
| H03K 19/0175 | (2006.01) |
| H03K 21/02 | (2006.01) |

(52) U.S. Cl.
CPC ............. *G04F 10/005* (2013.01); *H03K 5/135* (2013.01); *H03K 19/017509* (2013.01); *H03K 21/026* (2013.01); *H03M 1/50* (2013.01)

(58) Field of Classification Search
CPC ........................... G04F 10/005; H03K 21/026
USPC ................................ 341/155, 166, 157, 164
See application file for complete search history.

(56) References Cited

U.S. PATENT DOCUMENTS

| | | | | |
|---|---|---|---|---|
| 5,548,286 A | * | 8/1996 | Craven ............... | H03M 1/1038 332/107 |
| 8,254,435 B2 | * | 8/2012 | Kojima .................... | H03K 7/08 332/112 |
| 2012/0092052 A1 | | 4/2012 | Matsuda | |

FOREIGN PATENT DOCUMENTS

| | | |
|---|---|---|
| CN | 101572551 A | 11/2009 |
| CN | 102882527 A | 1/2013 |
| CN | 103401557 A | 11/2013 |

*Primary Examiner* — Peguy Jean Pierre
(74) *Attorney, Agent, or Firm* — Maschoff Brennan

(57) ABSTRACT

An annular time-to-digital converter includes a pulse shaper that shapes an input start pulse and an input stop pulse to form fixed-width pulses for output. The annular time-to-digital converter also includes at least two differential comparing units that enable, during matching enabling, triggers of the differential comparing units to set setting ends to 1. A circle counter counts the number of times a pulse is propagated in a loop. A matching enabling logical device generates a matching enabling signal, and sends the generated matching enabling signal to comparing enabling ports of the differential comparing units. At least two in-loop position encoders find a position of a first matched unit according to matching signals sent by the differential comparing units. Result recording registers record the number of circles and in-loop positions when matching occurs. High resolution is realized using a differential chain, and wafer area is saved by the annular design.

11 Claims, 3 Drawing Sheets

ANNULAR TIME-TO-DIGITAL CONVERTER AND METHOD THEREOF

TECHNICAL FIELD

The present invention relates to the field of time measurement, and in particular relates to an annular time-to-digital converter and a method thereof.

BACKGROUND

A time-to-digital converter (Time-to-Digital Converter, TDC) is a timer for converting time intervals into digital signals. The time-to-digital converter has wide application in the field of time measurement, including measurement of flight time, a phase detector in a phase-locked loop, a data converter, high-speed signal capture, a demodulator and other measurement or instrument application. The main objective of designing the TDC is to improve the resolution and provide a large dynamic range. A differential chain may realize a resolution smaller than a gate-level delay, and an annular TDC occupies a small area and has a large dynamic range.

There are two methods for realizing the TDC by using the differential chain in the prior art: A, a two-step method, namely time is coarsely measured and then measured by using the differential chain; and B, an annular differential structure is adopted, information including a coarse value, a fine value, an in-circle position and the like is recorded during measurement, and a measurement result is obtained by operation.

However, in the method A of the prior art, an additional measurement circuit is needed, so that the occupied area is too large and the structure is relatively complex; and the method B is only realized by using the annular structure, is skilful but complex in calculation, and involves multiple parameters.

SUMMARY

(1) Technical Problems to be Solved

The present invention provides an annular time-to-digital converter and a method thereof for solving the problems that the time-to-digital converter in the prior art occupies a large area and is complex in calculation.

(2) Technical Solutions

The present invention provides an annular time-to-digital converter, including:
a pulse shaper, used for shaping an input start pulse and an input stop pulse to form fixed-width pulses for output;
at least two differential comparing units, used for enabling, during matching enabling, triggers of the differential comparing units to set setting ends to 1;
a circle counter, used for counting the number of circles of propagating a pulse in a loop;
a matching enabling logical device, used for generating a matching enabling signal, and sending the generated matching enabling signal to comparing enabling ports of the differential comparing units;
at least two in-loop position encoders, used for determining a matching position of a matched unit according to matching signals sent by the differential comparing units; and result recording registers, used for recording the number of circles of propagating a pulse in a loop and the matching position when matching occurs.

Preferably, each differential comparing unit consists of two buffers, a trigger, an AND gate and an OR gate.

Preferably, the delay difference of the two buffers is Tr.

Preferably, the AND gate in each differential comparing unit is used for performing logical AND processing on the outputs of the two buffers and the matching enabling signal and sending to the setting end of the trigger.

Preferably, the trigger is an RS trigger.

Preferably, the circle counter is provided with two input ends, respectively a Ci end and a Cr end, wherein the Ci end is used for counting the number of circles of a long delay loop, and the Cr end is used for counting the number of circles of a short delay loop.

Preferably, the matching enabling logical device is an RS trigger, and generates the matching enabling signal when the numbers of circles counted by the Ci end and the Cr end are equal.

The present invention further provides an annular time-to-digital conversion method, including:
S1, inputting a start pulse and a stop pulse at two input ends of a pulse shaper respectively, and shaping the start pulse and the stop pulse to form fixed-width pulses for output;
S2, sending the output start pulse and the output stop pulse to a long delay loop and a short delay loop respectively;
S3, when the rising edge of the start pulse arrives at the Ci end of a circle counter, adding 1 to the Ci end of the circle counter;
when the rising edge of the stop pulse arrives at the Cr end of the circle counter, adding 1 to the Cr end of the circle counter;
S4, when the Ci end of the circle counter is equal to the Cr end, generating, by a matching enabling logical device, a matching enabling signal, setting, by triggers of differential comparing units, setting ends to 1, recording a matching position of a matched unit, and sending the generated matching enabling signal to comparing enabling ports of the differential comparing units;
S5, transmitting the matching enabling signal through a matching transmission chain, and recording, by result recording registers, the count value in the circle counter and in-loop position encoding values.

Preferably, the method further includes a step of initializing an annular time-to-digital converter before step S1.

Preferably, the method of initializing the annular time-to-digital converter includes:
resetting the triggers in the annular time-to-digital converter, and cutting off and resetting loops through And gates at the entrances of a long delay loop and a short delay loop.

Preferably, in step S5, the circle counter sends the count value to a first result recording register;
in-loop position encoders send in-loop position encoding values to a second result recording register according to matching signal output codes.

(3) Beneficial Effects

The present invention provides an annular time-to-digital converter and a method thereof, which realize high resolution by using a differential chain and save the wafer area by adopting annular design.

DETAILED DESCRIPTION OF THE PREFERRED EMBODIMENTS

The technical solutions in the embodiments of the present invention will be clearly and completely described below in combination with the accompanying drawings in the embodiments of the present invention.

Figure 1:
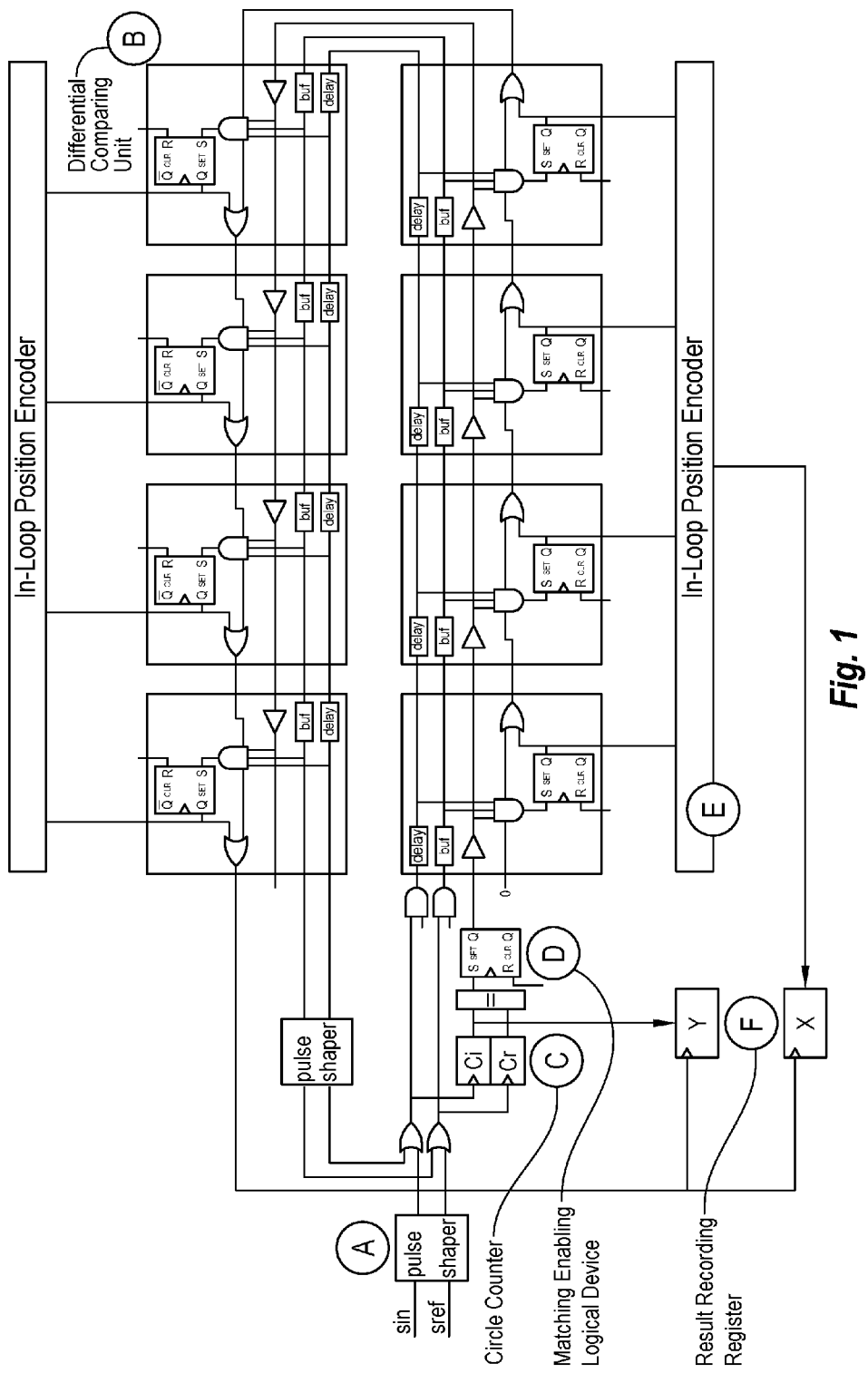
FIG. 1 is a schematic diagram of an annular time-to-digital converter provided by the present invention.
Figure 2:
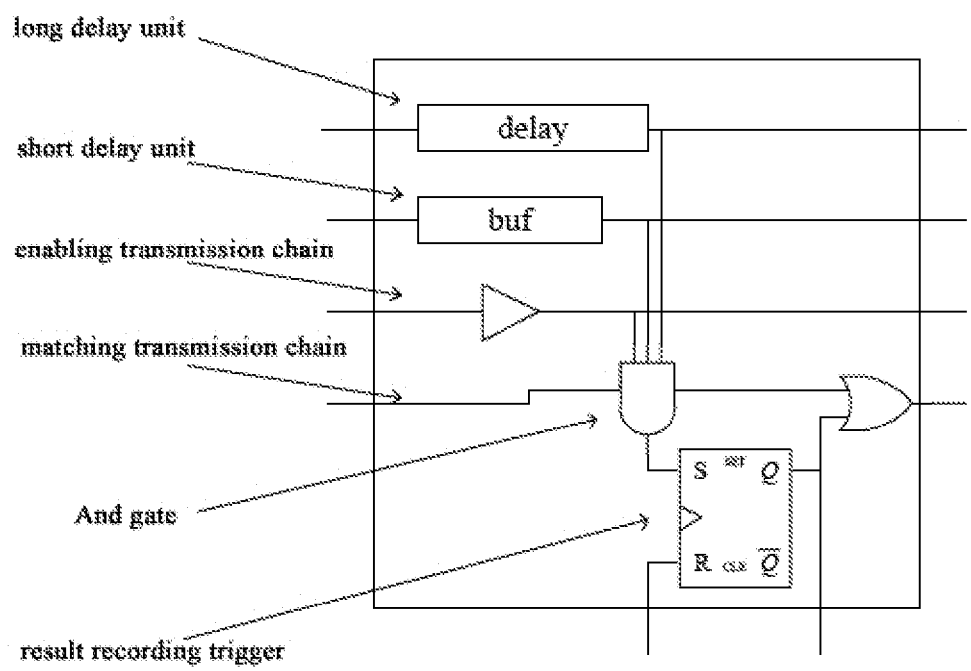
FIG. 2 is a schematic diagram of a differential comparing unit provided by the present invention.

The present invention provides an annular time-to-digital converter, as shown in FIG. 1, mainly including:

a pulse shaper, having the effect of inputting a pulse of any width and converting the pulse of any width into a fixed-width pulse for output, and used for shaping an input start pulse and an input stop pulse to form fixed-width pulses for output;

at least two differential comparing units, as shown in FIG. 2, each differential comparing unit is a segment of a differential chain and consists of two buffers, a trigger, an AND gate and an OR gate, the delay difference of the two buffers is Tr, wherein delay is a long delay unit, buf is a short delay unit, the differential comparing units are used for enabling, during matching enabling, triggers of the differential comparing units to set setting ends to 1, and the trigger is an RS trigger and serves a result recording trigger in the differential comparing unit;

a circle counter, used for counting the number of times of propagating a pulse in a loop, wherein the circle counter is provided with two input ends, namely a Ci end and a Cr end, the Ci end is used for counting the number of circles of a long delay loop, and the Cr end is used for counting the number of circles of a short delay loop;

a matching enabling logical device, used for generating a matching enabling signal, and sending the generated matching enabling signal to comparing enabling ports of the differential comparing units;

at least two in-loop position encoders, used for determining a matching position of a matched unit according to matching signals sent by the differential comparing units; and result recording registers, used for recording the number of circles of propagating a pulse in a loop and the matching position when matching occurs.

The AND gate in each differential comparing unit is used for performing logical AND processing on the outputs of the two buffers and the matching enabling signal and sending to the setting end of the trigger.

The matching enabling logical device is an RS trigger, and generates the matching enabling signal when the numbers of circles counted by the Ci end and the Cr end are equal.

Figure 3:
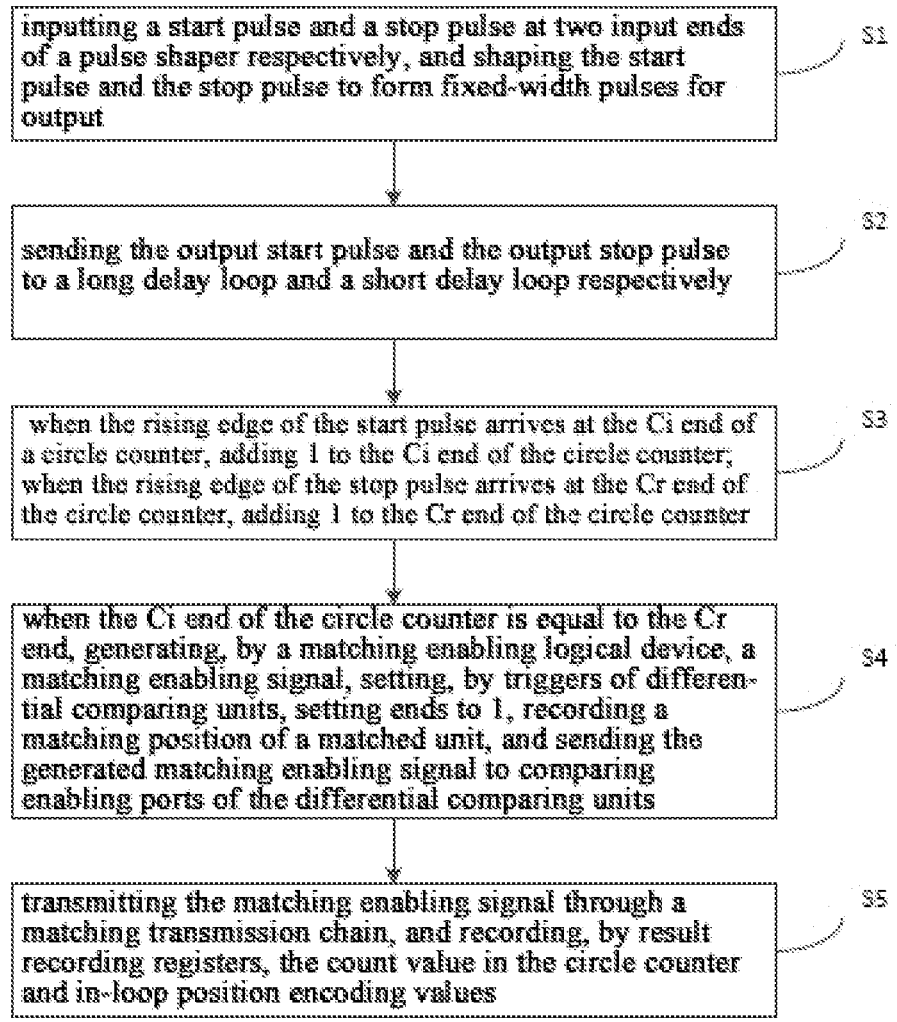
FIG. 3 is a flow diagram of an annular time-to-digital conversion method provided by the present invention.

The present invention further provides an annular time-to-digital conversion method, as shown in FIG. 3, including:

S1, inputting a start pulse and a stop pulse at two input ends of a pulse shaper respectively, and shaping the start pulse and the stop pulse to form fixed-width pulses for output;

S2, sending the output start pulse and the output stop pulse to a long delay loop and a short delay loop respectively;

S3, when the rising edge of the start pulse arrives at the Ci end of a circle counter, adding 1 to the Ci end of the circle counter;

when the rising edge of the stop pulse arrives at the Cr end of the circle counter, adding 1 to the Cr end of the circle counter;

S4, when the Ci end of the circle counter is equal to the Cr end, generating, by a matching enabling logical device, a matching enabling signal, setting, by triggers of differential comparing units, setting ends to 1, recording a matching position of a matched unit, and sending the generated matching enabling signal to comparing enabling ports of the differential comparing units; and S5, transmitting the matching enabling signal through a matching transmission chain, and recording, by result recording registers, the count value in the circle counter and in-loop position encoding values.

The method further includes a step of initializing an annular time-to-digital converter before step S1, and the method of initializing the annular time-to-digital converter includes:

resetting the triggers in the annular time-to-digital converter, and cutting off and resetting loops through And gates at the entrances of a long delay loop and a short delay loop.

The circle counter sends the count value to a first result recording register Y for recording;

in-loop position encoders send in-loop position encoding values to a second result recording register X according to matching signal output codes for recording.

The above embodiments are merely used for describing the present invention, rather than limiting the present invention. Various modifications and variations may also be made by those of ordinary skill in the relevant technical field without departing from the spirit and scope of the present invention. Accordingly, all equivalent technical schemes fall into the scope of the present invention, and the patent protection scope of the present invention shall be defined by the claims.

The invention claimed is:

1. An annular time-to-digital converter, comprising:
   a pulse shaper;
   a differential chain comprising at least two differential comparing units coupled in a ring, wherein a first one of the at least two differential comparing units includes an input coupled to an output of the pulse shaper and wherein a last one of the at least two differential comparing units includes an output coupled to the input of the first one of the at least two differential comparing units;
   a circle counter coupled to the output of the last one of the at least two differential comparing units;
   a matching enabling logical device that includes an output coupled to comparing enabling ports of each of the at least two differential comparing units;
   at least two in-loop position encoders, wherein each of the at least two in-loop position encoders is coupled to at least one of the at least two differential comparing units; and
   at least two result recording registers coupled to outputs of the at least two in-loop position encoders.

2. The annular time-to-digital converter of claim 1, wherein each differential comparing unit consists of:
   two buffers, including a short delay buffer coupled in the ring with short delay buffers of all differential comparing units in the differential chain; and a long delay buffer coupled in the ring with long delay buffers of all differential comparing units the differential chain;
   an AND gate that includes a first input coupled to outputs of the two buffers and a second input coupled to an output of the matching enabling logical device;
   a trigger that includes a set input coupled to an output of the AND gate and an output coupled to a corresponding one of the in-loop position encoders; and an OR gate that includes a first input coupled to the output of the AND gate and a second input coupled to the output of the trigger.

3. The annular time-to-digital converter of claim 2, wherein a delay difference of the two buffers is Tr.

4. The annular time-to-digital converter of claim 2, wherein the AND gate in each differential comparing unit is configured to:
   perform logical AND processing on the outputs of the two buffers when enabled by a matching enabling signal output by the matching enabling logical device; and
   send a result of the logical AND processing to the set input of the trigger.

5. The annular time-to-digital converter of claim 2, wherein the trigger is a set-reset (SR) latch.

6. The annular time-to-digital converter of claim 1, wherein:
   the circle counter includes two input ends, respectively a Ci end and a Cr end;
   the Ci end is coupled to a long delay loop included in the ring;
   the Cr end is coupled to a short delay loop included in the ring;
   the Ci end is configured to count a number of times a start pulse propagates through the long delay loop; and
   the Cr end is configured to count a number of times a stop pulse propagates through the short delay loop.

7. The annular time-to-digital converter of claim 1, wherein the matching enabling logical device is a set-reset (SR) latch and is configured to generate a matching enabling signal when the numbers start pulse propagation times counted by the Ci end and the number of stop pulse propagation times counted by the Cr end are equal.

8. An annular time-to-digital conversion method, comprising:
   inputting a start pulse and a stop pulse at two input ends of a pulse shaper respectively, and shaping the start pulse and the stop pulse to form fixed-width pulses for output;
   sending the output start pulse to a long delay loop and the output stop pulse to a short delay loop;
   when a rising edge of the start pulse arrives at a Ci end of a circle counter, adding 1 to the Ci end of the circle counter;
   when a rising edge of the stop pulse arrives at a Cr end of the circle counter, adding 1 to the Cr end of the circle counter;
   when the Ci end of the circle counter is equal to the Cr end, generating, by a matching enabling logical device, a matching enabling signal;
   sending the generated matching enabling signal to comparing enabling ports of at least two differential comparing units coupled in a ring;
   transmitting the matching enabling signal through a matching transmission chain, and recording, by result recording registers, a count value in the circle counter when the Ci end is equal to the Cr end and in-loop position encoding values.

9. The method of claim 8, further comprising initializing an annular time-to-digital converter before the inputting.

10. The method of claim 9, wherein the initializing comprises:
    resetting triggers in the annular time-to-digital converter that were triggered in response to the matching enabling signal; and
    cutting off and resetting the long delay loop and the short delay loop through AND gates at entrances of the long delay loop and the short delay loop.

11. The method of claim 8, wherein recording the count value includes sending the count value to a first result recording register and sending in-loop position encoding values to a second result recording register.

* * * * *